United States Patent [19]
Ogawa et al.

[11] Patent Number: 5,804,987
[45] Date of Patent: Sep. 8, 1998

[54] LSI CHIP HAVING PROGRAMMABLE BUFFER CIRCUIT

[75] Inventors: Kyohsuke Ogawa, Yokohama; Yasunori Tanaka, Yokosuka, both of Japan

[73] Assignee: Kabushiki Kaisha Toshiba, Kawasaki, Japan

[21] Appl. No.: 636,131

[22] Filed: Apr. 22, 1996

Related U.S. Application Data

[63] Continuation of Ser. No. 380,219, Jan. 30, 1995, abandoned, which is a continuation of Ser. No. 66,192, May 25, 1993, abandoned.

[30] Foreign Application Priority Data

May 26, 1992 [JP] Japan ................................ 4-133478

[51] Int. Cl.$^6$ ........................ H03K 19/173; H03K 19/08
[52] U.S. Cl. ............................... 326/40; 326/46; 326/82; 326/37; 377/76
[58] Field of Search ..................... 307/465, 475, 307/443; 377/64, 76; 326/37, 39–40, 46, 82–83, 87

[56] References Cited

U.S. PATENT DOCUMENTS

| | | | |
|---|---|---|---|
| 4,870,302 | 9/1989 | Freeman | 326/41 |
| 4,896,296 | 1/1990 | Turner et al. | 365/189.08 |
| 4,930,098 | 5/1990 | Allen | 307/465 |
| 4,940,909 | 7/1990 | Mulder et al. | 307/465 |
| 4,942,317 | 7/1990 | Tanaka et al. | 307/465 |
| 5,015,969 | 5/1991 | Barclay et al. | 330/284 |
| 5,018,013 | 5/1991 | Rabii | 358/181 |
| 5,039,874 | 8/1991 | Anderson | 307/270 |
| 5,134,311 | 7/1992 | Biber et al. | 326/82 |
| 5,144,166 | 9/1992 | Camarota et al. | 326/40 |
| 5,153,450 | 10/1992 | Ruetz | 307/475 |
| 5,185,706 | 2/1993 | Agrawal et al. | 307/465 |
| 5,220,216 | 6/1993 | Woo | 326/87 |
| 5,302,866 | 4/1994 | Chiang et al. | 307/465 |
| 5,394,034 | 2/1995 | Becker et al. | 326/39 |
| 5,444,406 | 8/1995 | Horne | 326/83 |

FOREIGN PATENT DOCUMENTS

| | | |
|---|---|---|
| 2-92019 | 3/1990 | Japan . |
| 4-150228 | 5/1992 | Japan . |

*Primary Examiner*—Edward P. Westin
*Assistant Examiner*—Jon Santamauro
*Attorney, Agent, or Firm*—Finnegan, Henderson, Farabow, Garrett & Dunner, L.L.P.

[57] ABSTRACT

An LSI chip is mounted on an LSI board. Sub-buffer circuit areas where input buffers, output buffers or input/output buffers are to be formed are provided in signal lines extending from the pad to the internal circuit of the LSI chip. Each sub-buffer circuit area has a plurality of basic elements, such as transistors and resistors, connected in parallel to one another so that different combinations of those elements can be selected by switches. A latch controller is incorporated in the LSI chip, and it has latch circuits serially connected to form a shift register structure. This latch controller sends a program signal for determining the buffer circuit characteristic to the sub-buffer circuit areas. This program signal is generated when program data is input to the latch controller. The program data is given serially via input buffers from the pads on the LSI chip. The latch controller transfers the program data to the latch circuits one after another in synchronism with a clock signal. Those pads connected to the output buffers become signal extending terminals to another circuit.

6 Claims, 13 Drawing Sheets

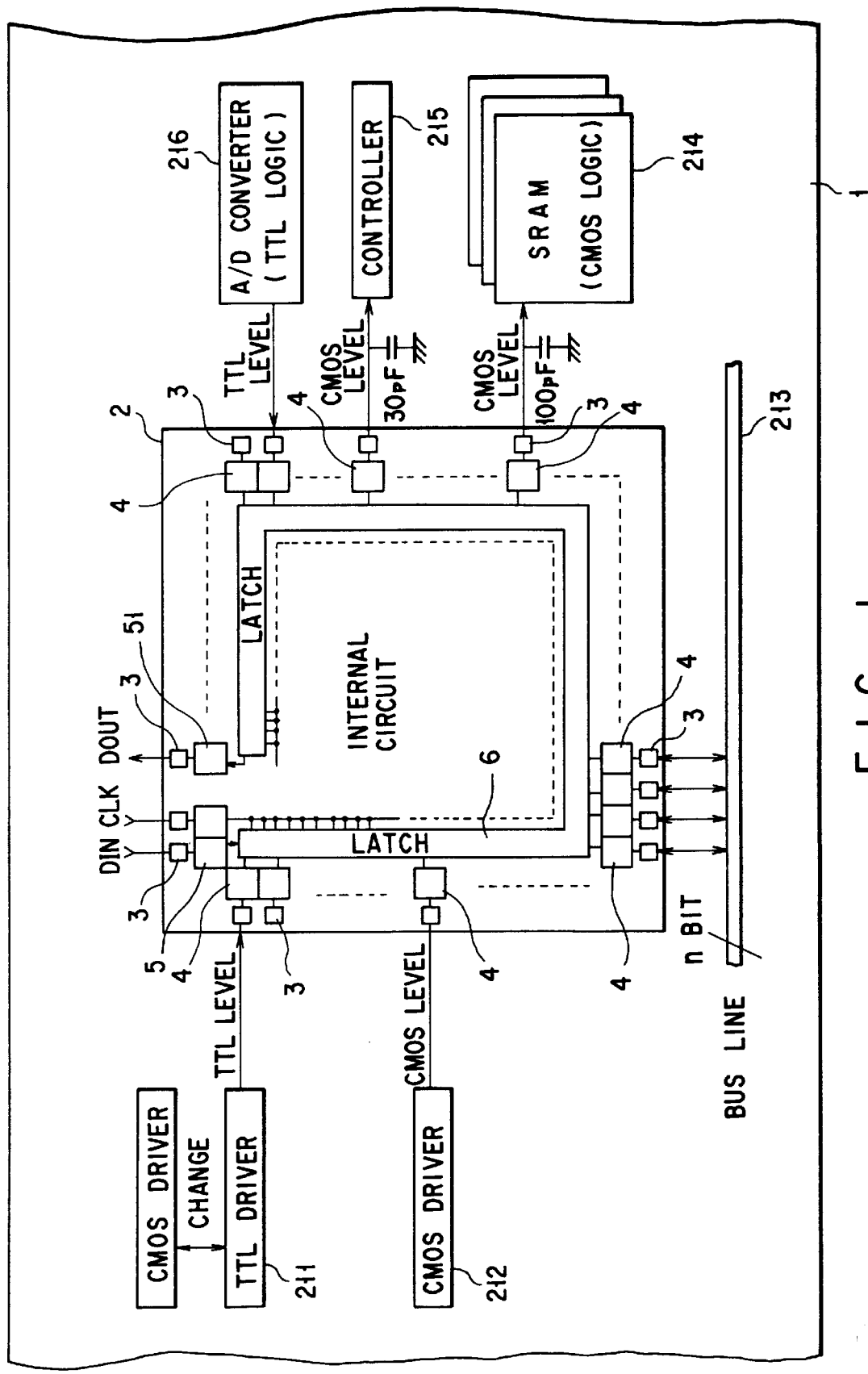
F I G. 1

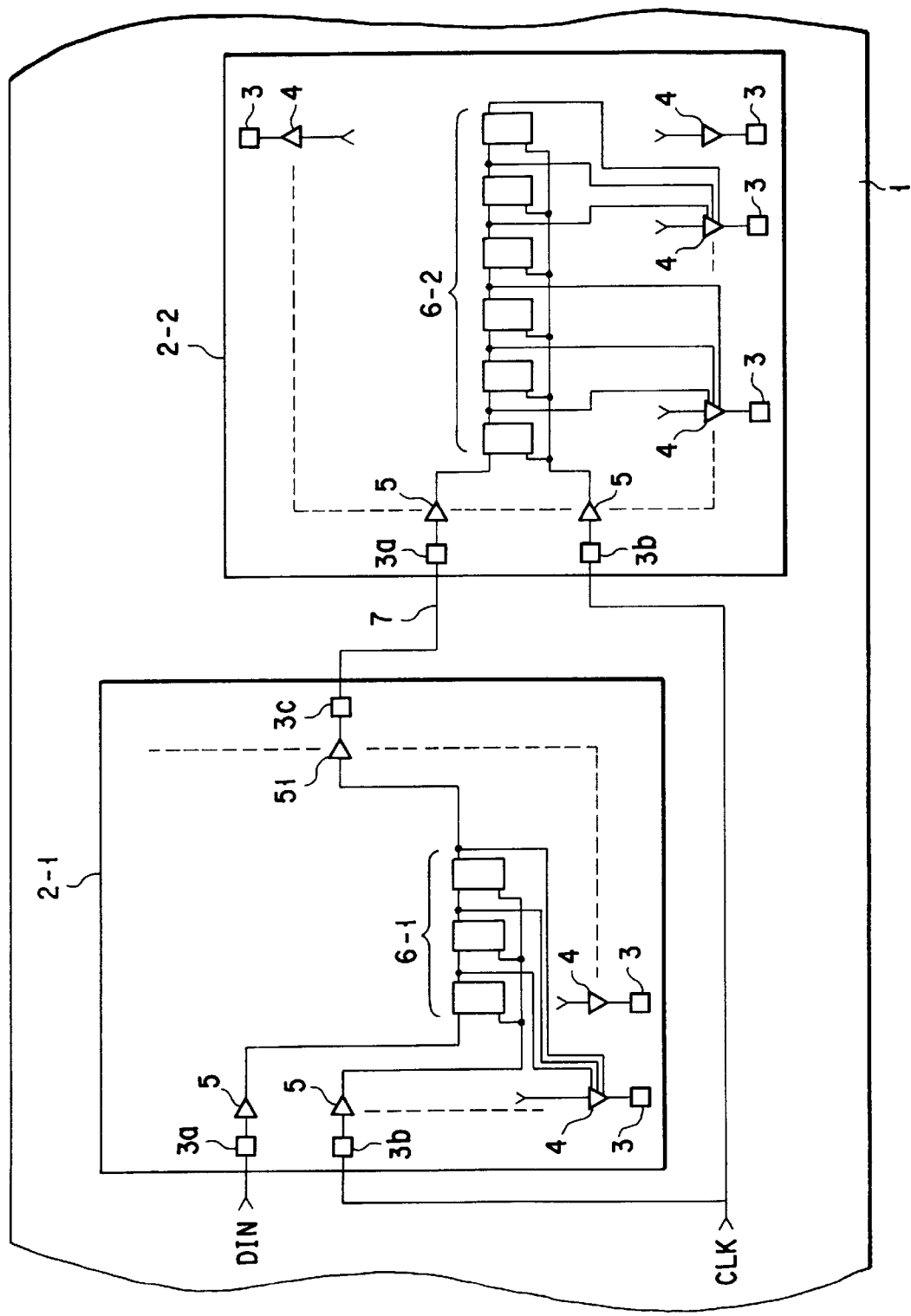
F I G. 3

| 4a-1 (Io=4mA) E0 | 4b-1 (Io=8mA) E1 | 4c-1 (Io=12mA) E2 | Output current of buffer 4 Iot (mA) |
|---|---|---|---|
| 0 | 0 | 0 | HZ |
| 0 | 0 | 1 | 12 |
| 0 | 1 | 0 | 8 |
| 0 | 1 | 1 | 20 |
| 1 | 0 | 0 | 4 |
| 1 | 0 | 1 | 16 |
| 1 | 1 | 0 | 12 |
| 1 | 1 | 1 | 24 |

F I G. 12

| 4a-3 (gm=3) E0 | 4b-3 (gm=2) E1 | 4c-3 (gm=1) | gm of pre-stage portion 4P1 |
|---|---|---|---|
| 0 | 0 | — | 1 |
| 0 | 1 | — | 3 |
| 1 | 0 | — | 4 |
| 1 | 1 | — | 6 |

F I G. 13

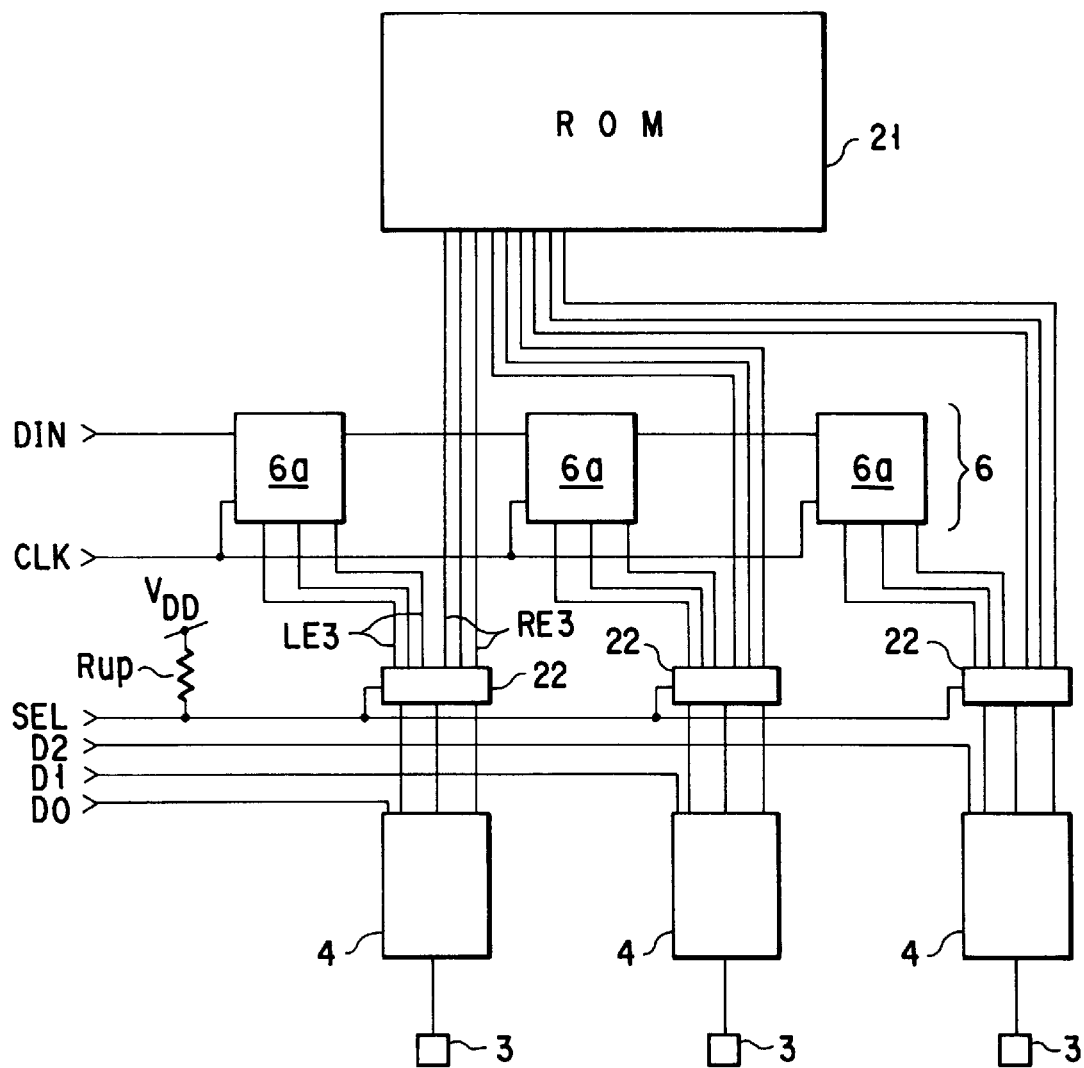
F I G. 21

LSI CHIP HAVING PROGRAMMABLE BUFFER CIRCUIT

This application is a continuation of application Ser. No. 08/380,219, filed Jan. 30, 1995, now abandoned, which is a continuation of application Ser. No. 08/066,192, filed May 25, 1993, now abandoned.

BACKGROUND OF THE INVENTION

1. Field of the Invention

The present invention relates to a buffer circuit which is incorporated particularly in an LSI chip and can change the functions and characteristics of its input buffer circuit, output buffer circuit and input/output buffer circuit in accordance with the application.

2. Description of the Related Art

PLD (Programmable Logic Device) is a logic IC which allows a user to design the desired circuit and program the gates in the IC so that the user can make a special-purpose IC that meets a user's purpose or application in a short period of time, and is categorized into ASIC (Application Specific Integrated Circuit).

In order to realize the system specifications a user wants, buffer circuits of LSI chips such as PLDs generally need to be designed to have characteristics which meet those specifications.

After manufacturing LSI chips, the user may change the specifications or will test the functions of the chips. If the load drive power of the output buffer circuits connected to the pads of each LSI chip is too large, noise may occur. If this load drive power is too small, on the other hand, it may not satisfy the specification of the operation speed. In those cases, the output characteristic should be altered.

To cope with this alteration of the output characteristic without increasing the manufacturing cost of the chips and the time for the development of the chips, each PLD has a plurality of input/output buffer circuits having predetermined output characteristics respectively and fixedly pre-arranged, as spare cells, in the vicinity of the pads around the chip. The individual spare cells have control terminals led out of the chip so that the operations of the spare cells are controllable by a control signal applied to the control terminals. With this design, the user's request to alter the characteristic of the buffer circuit can be coped with to some degree.

While this scheme can avoid increasing the chip developing time even when the mask data is changed, it requires, for each spare cell, a pad and an input circuit for externally receiving a control signal. This increases the chip area significantly and results in a higher manufacturing cost.

SUMMARY OF THE INVENTION

It is therefore an object of the present invention to provide an LSI chip which can facilitate alteration of the input or output characteristic that becomes necessary after manufacturing the LSI chip without increasing the chip area and manufacturing cost, and which can significantly shorten the chip developing time.

To achieve this object, according to the present invention, there is provided a programmable buffer circuit arranged between pads of an LSI chip for external connection and an internal circuit of the LSI chip, which buffer circuit comprises:

sub-buffer circuit means, provided in signal lines from the pads to the internal circuit of the LSI chip, for permitting alteration of the characteristic of the buffer circuit;

receiving means for receiving a program signal to be given to the sub-buffer circuit means to determine the characteristic of the buffer circuit; and latch means, incorporated in the LSI chip and controllable by program data supplied from the outside of the LSI chip to supply the program signal to the receiving means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit block diagram illustrating the schematic structure of one embodiment of the present invention;

FIG. 3 is a circuit block diagram showing the essential portion of a second portion according to the present invention;

FIG. 12 presents a diagram showing the correlation of signals for determining the value of the output current of the circuit shown in FIG. 6;

FIG. 13 presents a diagram showing the correlation of signals for determining the value of the conductance of the circuit shown in FIG. 8;

FIG. 21 is a circuit diagram illustrating the structure of another embodiment of the present invention.

DETAILED DESCRIPTION OF THE PREFERRED EMBODIMENTS

Figure 2:
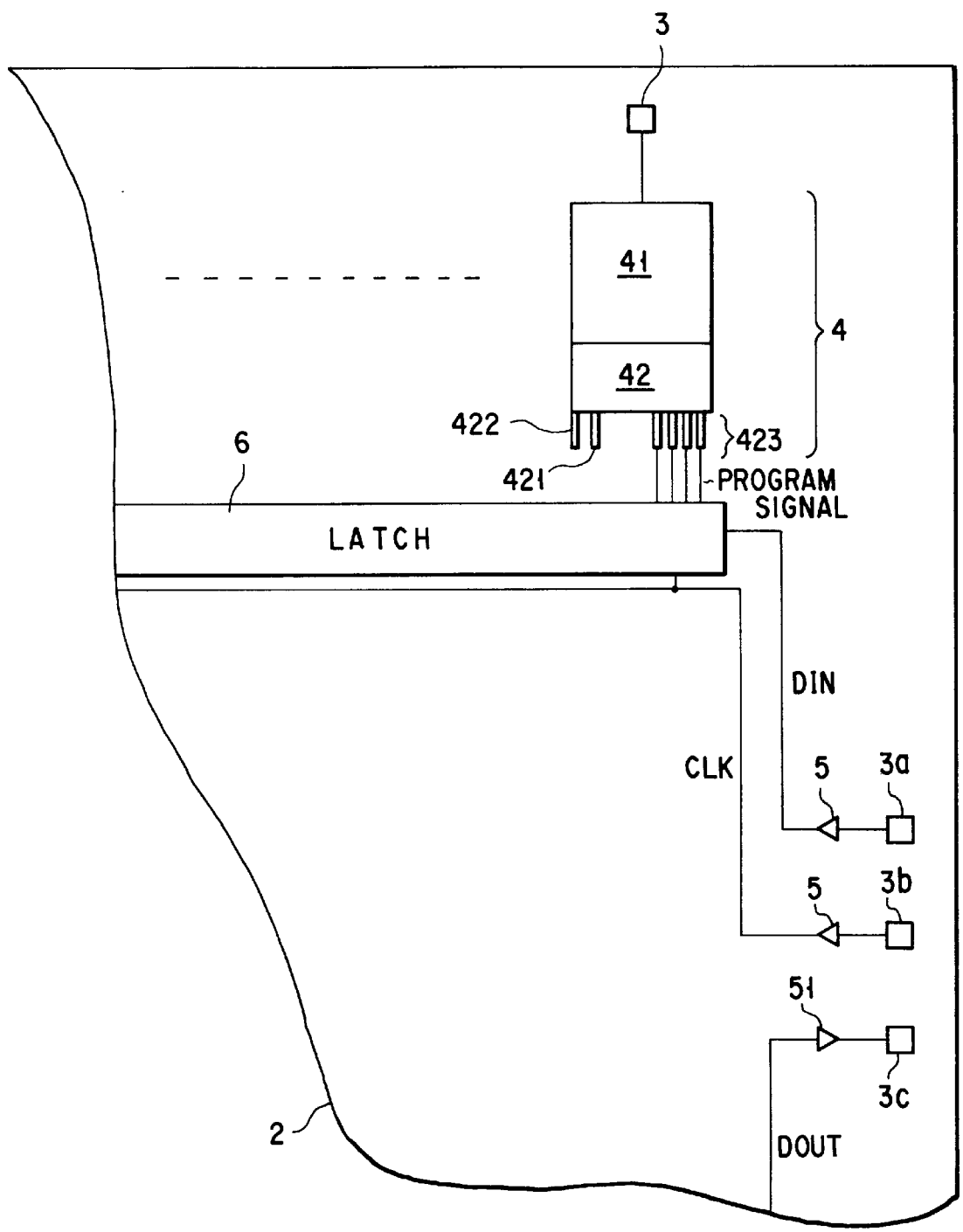
FIG. 2 is a circuit block diagram showing the essential portion of a first portion according to the present invention.

Preferred embodiments of the present invention will now be described referring to the accompanying drawings.

FIG. 1 is a circuit block diagram schematically illustrating the structure of a buffer circuit according to one embodiment of the present invention. An LSI chip 2 is mounted on an LSI board 1. A plurality of pads 3 for external connection are provided on this LSI chip 2. Sub-buffer circuit areas 4 where input buffers, output buffers or input/output (I/O) buffers are to be formed are provided in signal lines extending from the pad 3 to the internal circuit of the LSI chip 2. Each sub-buffer circuit area 4 has a plurality of basic elements, such as transistors and resistors, arranged to one another so that different combinations of those elements can be selected by switches.

A latch controller 6 is incorporated in the LSI chip 2, and it has latch circuits serially connected to form a shift register structure. This latch controller 6 sends a program signal for determining the buffer circuit characteristic to the sub-buffer circuit areas 4. This program signal is generated when program data DIN is input to the latch controller 6. The program data DIN, serial data, is given via input buffers 5 from the pads 3 on the LSI chip 2. The latch controller 6 transfers the program data DIN to the latch circuits one after another in synchronism with a clock signal CLK. The program data DIN may be sent via output buffers 51 to another external circuit. At this time, those pads 3 connected to the output buffers 51 become signal extending terminals to that external circuit.

The interface with other devices on the circuit board 1 is accomplished by a TTL driver 211, a CMOS driver 212, a multi-bit bus line 213, an SRAM 214, etc. It is therefore necessary to meet various interface requests originating from the difference in function (input, output, input/output), the difference in input/output level (CMOS or TTL), the difference in load (drive power). For instance, when the specifications of the circuit board 1 are altered after the fabrication of the LSI chip so that the TTL driver 211 should be changed to the CMOS driver 212, the latch controller 6 sends a program signal to determine the buffer circuit characteristic to the associated sub-buffer circuit areas 4 in accordance with the program data DIN and clock signal CLK to thereby set the buffer circuit characteristic of the sub-buffer circuit areas to the desired circuit characteristic.

FIG. 2 presents a circuit block diagram showing the essential portion of the sub-buffer circuit area 4 according to the present invention. The sub-buffer circuit areas 4 are provided in association with the pads 3 on the LSI chip 2. Each sub-buffer circuit area 4 includes a basic element group section 41 having basic elements, such as transistors and resistors, arranged therein, and a control switch group section 42 which allows for the proper connection of those basic elements to be selected. The control switch group section 42 has a plurality of program terminals 423 led out to receive the program signal as well as a signal input terminal 421 and a signal output terminal 422 both for connection to the internal circuit of the chip. The program signal, the parallel output of the latch controller 6, is input to the program terminals 423. This design makes it possible to set the characteristic of the buffer circuit in accordance with a change in interface specification after the fabrication of the LSI chip, a change in process, and a variation in voltage, temperature and so forth. Pads 3a and 3b receive the aforementioned program data DIN and clock signal CLK, respectively. A pad 3c is coupled to the output of the last one of the latch circuits in the latch controller 6 to which the program signal is sequentially transferred. The pad 3c serves as a signal extending terminal to serially connect the program data DIN to some other chips on the same board which have the same function as this embodiment.

FIG. 3 is a circuit block diagram showing the essential portion of the latch circuit 6 (6-1, 6-2) according to the present invention. LSI chips 2-1 and 2—2 are provided on the same board 1. As described above, the latch controllers 6-1 and 6-2 each comprise a plurality of latch circuits. The parallel outputs of the latch controllers 6-1 and 6-2 are connected to the program terminals of the sub-buffer circuit areas 4. The parallel output of the latch controller 6-1 or 6-2 is manipulated by the program data DIN to electrically program the characteristic of the associated buffer circuit, for example, an output buffer. As a result, the output buffer 4 will serve as a single output buffer having the desired output characteristic. The supply of the program data DIN from the latch controller 6-1 to the latch controller 6-2 is performed through the output buffer 51, a line 7 on the board 1 and the input buffer 5. The clock signal CLK is connected to the clock terminals of the latch controllers 6-1 and 6-2 via the associated input buffers 5.

Figure 4:
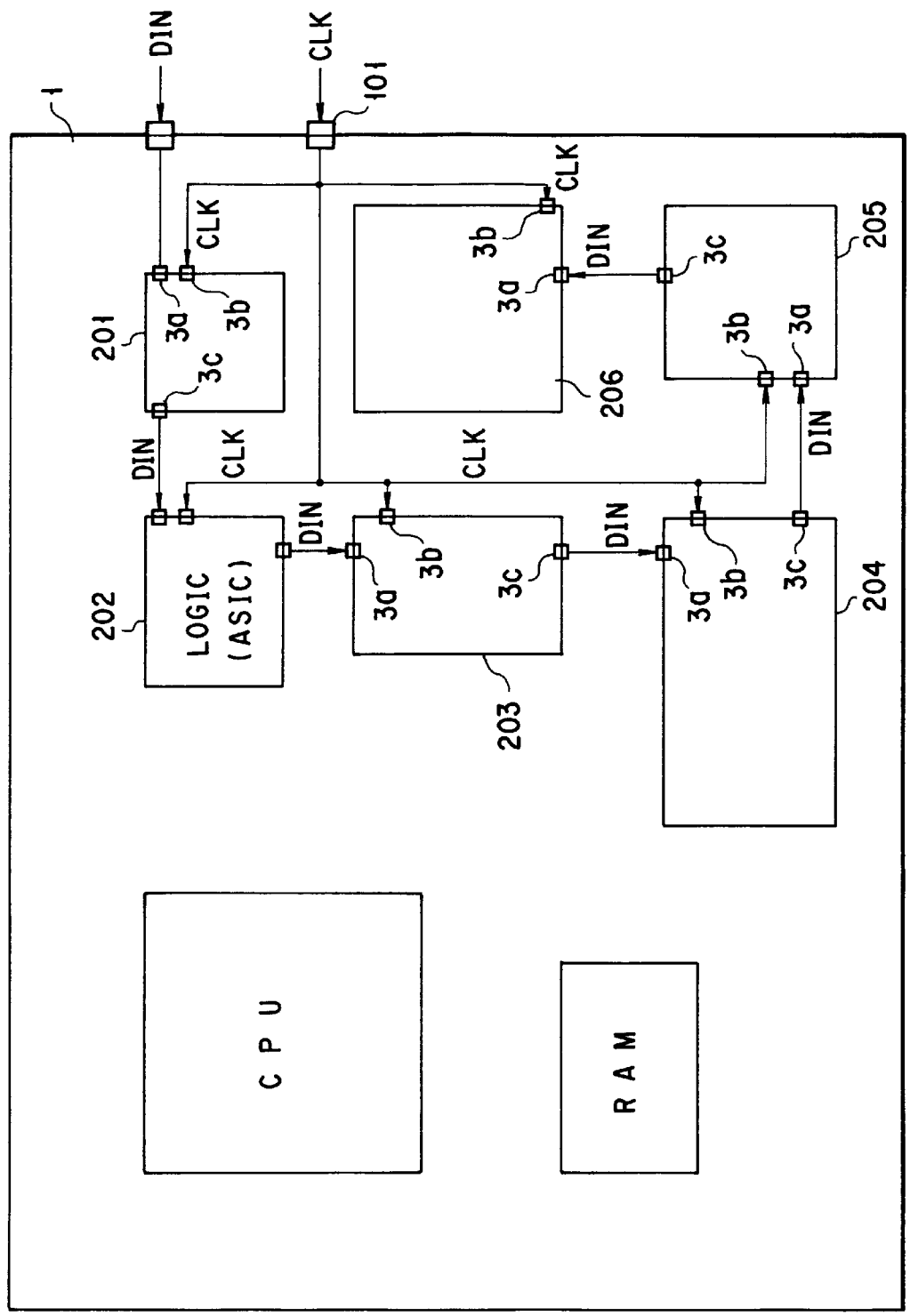
FIG. 4 presents a circuit block diagram illustrating the structure of one application of the present invention.

FIG. 4 presents a circuit block diagram illustrating the program data DIN serially connected to other chips on the same board which have the same function as that of this embodiment using the signal extending terminals according to the present invention. Provided on the board 1 are an input terminal 101 for the clock signal CLK and an input terminal 102 for the program data DIN. The program data DIN is shifted sequentially by the clock signal CLK to program the data held in the entire latch controllers located in the individual LSI chips 201 to 206. Accordingly, the characteristics of the buffer circuits associated with those latch controllers can freely be set to the desired characteristics after the fabrication of the chips.

Figure 5:
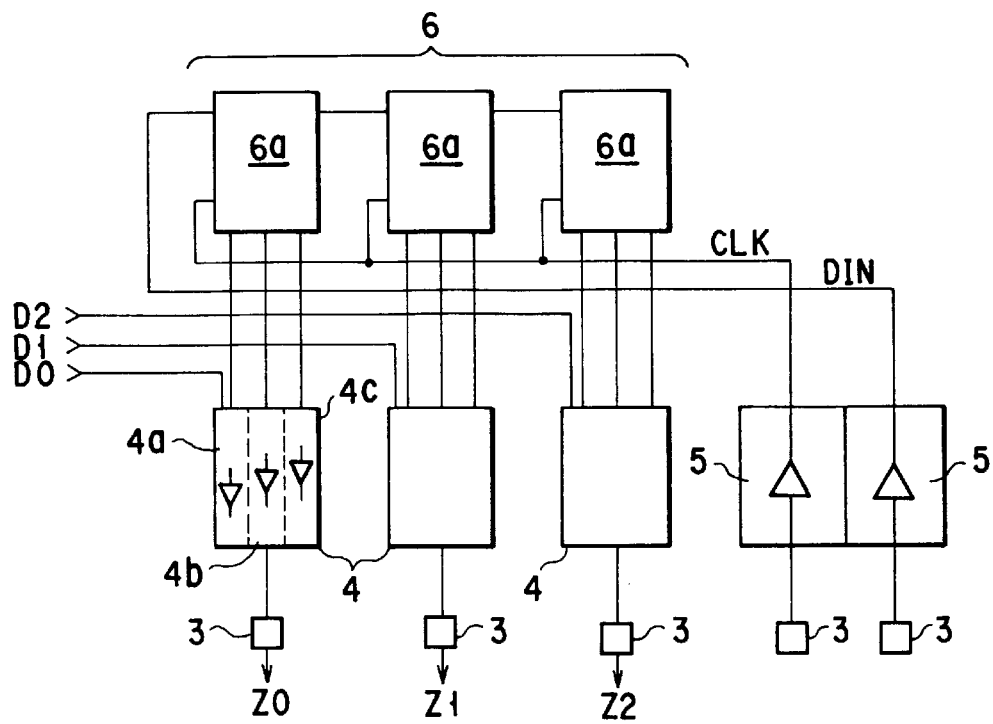
FIG. 5 presents a circuit diagram illustrating one specific structure of the essential portion of the present invention.

FIG. 5 presents a circuit diagram illustrating one specific structure of the present invention. The buffer circuit as a programmable output buffer is separated into three sub-buffers 4a, 4b and 4c in each sub-buffer circuit area 4. Three 3-bit latch circuits 6a are connected in series to constitute the latch controller 6. Each of the program data DIN and clock signal CLK is commonly supplied to the latch circuits 6a via the pad 3 and the input buffer 5.

The parallel output of the latch controller 6 is input to the program terminals of each of the sub-buffers 4a, 4b and 4c. Signals D0, D1 and D2 are input from the internal circuit of the chip to the respective output buffers 4, and signals Z0, Z1 and Z2 are output from the respective output buffers 4 via the associated pads 3.

FIGS. 6 through 11 show specific circuits of the above-described output buffer. Hereafter, the output buffer formed in the sub-buffer circuit area 4 will be referred to simply as "buffer 4."

First, the circuit in FIG. 6 will be described. Signals E0, E1 and E2 are input to the independent program terminals of sub-buffers 4a-1, 4b-1 and 4c-1, which constitute a three-state buffer, with a signal CDN being commonly input to the sub-buffers from the internal circuit of the chip. The output terminals of the sub-buffers are commonly connected to one pad 3 through which the output signals of those sub-buffers are output.

The value of the output current of the circuit of FIG. 6 may be determined in the following manner. By designing the output current values $I_o$ of the individual sub-buffers 4a-1, 4b-1 and 4c-1 respectively to 4 mA, 8 mA, and 12 mA, and combining the levels "0" and "1" of the signals E0, E1 and E2, the operations of the individual sub-buffers 4a-1, 4b-1 and 4c-1, and the output current value $I_{ot}$ of the sub-buffers as one buffer 4 can be changed.

FIG. 12 shows the correlation between the output current value $I_{ot}$ of the buffer 4 and the levels of the signals E0 to E2. For instance, with E0 set to "1," E1 to "0" and E2 to "1," the sub-buffers 4a-1 and 4c-1 become conductable while the sub-buffer 4b-1 becomes unconductable. Therefore, the output current value of a single buffer 4 is 4+12=16 mA.

In the example in FIG. 12, the output current value $I_{ot}$ of the buffer 4 can be changed to seven levels, 4 mA, 8 mA, 12 mA, 16 mA, 20 mA, 24 mA and HZ (high impedance), by different combinations of "0" and "1" of the signals E0, E1 and E2.

The circuit in FIG. 7 will now be described. Sub-buffers 4a-2, 4b-2 and 4c-2 receive a common input signal CDN from the internal circuit of the chip and have their outputs connected to the input sides of associated transfer gates TG1. The outputs of the individual transfer gates TG1 are all connected to one pad 3. Signals EN0, EN1 and EN2 are respectively input to the independent program terminals of the gates TG1.

Figure 6:
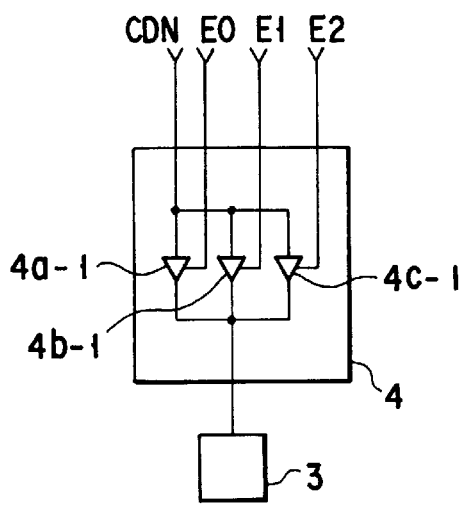
FIG. 6 is a first specific circuit diagram of the present invention, exemplifying the structure of an output buffer circuit.
Figure 7:
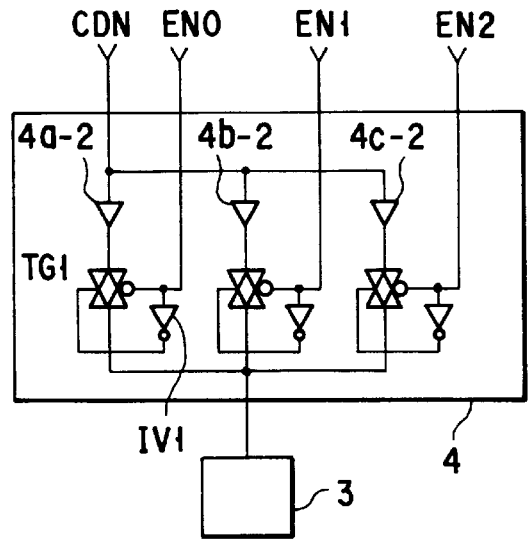
FIG. 7 is a second specific circuit diagram of the present invention, exemplifying the structure of an output buffer circuit.

In the circuit of FIG. 7, as in the structure of FIG. 6, the output current value of one buffer 4 can be changed by designing the output current values of the sub-buffers 4a-2, 4b-2 and 4c-2 to predetermined values and selecting the proper combination of "0" and "1" of the signals EN0, EN1 and EN2.

The circuit in FIG. 8 will now be described. The signal CDN is commonly supplied to clocked inverters 4a-3 and 4b-3 and an inverter 4c-3, which serve as sub-buffers. The outputs of those inverters are connected together to form a pre-stage portion 4P1 which is connected to the input of a last-stage inverter 4m-1. The output of this inverter 4m-1 is connected to one pad 3.

Figure 8:
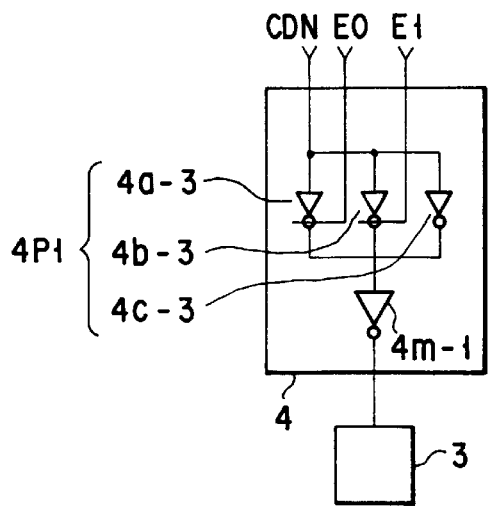
FIG. 8 is a third specific circuit diagram of the present invention, exemplifying the structure of an output buffer circuit.

The circuit of FIG. 8 is so designed that the output through rate of the last-stage inverter 4m-1 can be controlled by changing the value of the conductance gm of the pre-stage portion 4P1. This control may be performed as follows. The ratio of the values of gm of the clocked inverters 4a-3 and 4b-3 and the inverter 4c-3 are designed to 3:2:1. Then, the operations of the clocked inverters 4a-3 and 4b-3 are controlled by the combination of "0" and "1" of the signals E0 and E1.

FIG. 13 shows the values of gm of the pre-stage portion 4P1 with respect to the signals E0 and E1. For instance, with E0 set to "0" and E1 to "1," the clocked inverter 4a-3 becomes unconductable and the clocked inverter 4b-3 becomes conductable. Therefore, the value of gm of the pre-stage portion 4P1 for driving the last-stage inverter 4m-1 is 2+1=3.

In the example of FIG. 13, with gm of the inverter 4c=3 set to "1" and different combinations of "0" and "1" of the signals E0 and E1, gm of the pre-stage portion 4P1 can be changed to four levels of 1, 3, 4 and 6. Accordingly, the slew rate of the last-stage inverter 4m-1 can be controlled in four levels.

Figure 9:
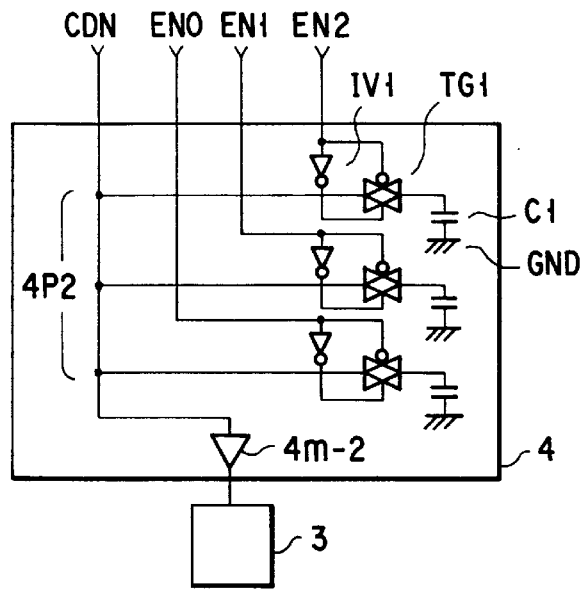
FIG. 9 is a fourth specific circuit diagram of the present invention, exemplifying the structure of an output buffer circuit.

The circuit in FIG. 9 will now be described. The outputs of three transfer gates TG1 are commonly connected to the input terminal of a last-stage buffer 4m-2 to which the signal CDN from the internal circuit of the chip is input. The signals EN0, EN1 and EN2 are respectively input to the independent program terminals of the three transfer gates TG1. A capacitor C1 is connected between the ground GND and the input side of each transfer gate TG1.

When the value of the capacitor C1 in a pre-stage portion 4P2 having the above structure is designed to a predetermined value and the levels of the signals EN0, EN1 and EN2 are properly combined, the capacitance of the input terminal of the last-stage buffer 4m-2 can be altered. It is therefore possible to control the output slew rate of the last-stage buffer 4m-2 in accordance with the determined capacitance as in FIG. 8.

Figure 10:
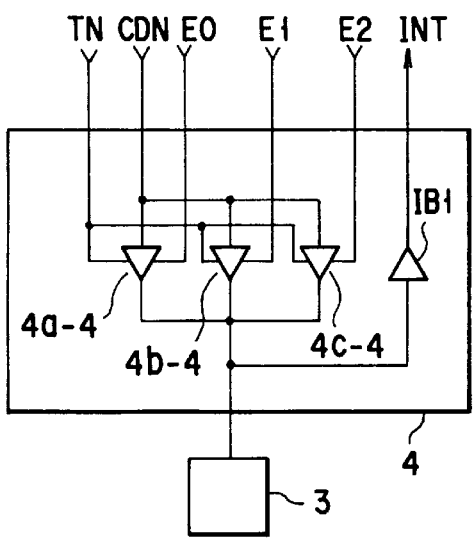
FIG. 10 is a fifth specific circuit diagram of the present invention, exemplifying the structure of an output buffer circuit.

The circuit in FIG. 10 will now be described. This circuit is a modification of the circuit in FIG. 6. The signals E0, E1 and E2 are respectively input to the independent program terminals of sub-buffers 4a-4, 4b-4 and 4c-4. There is a separate program terminal to which a signal TN is input and which is commonly connected to those sub-buffers. An input buffer IB1 is added to this structure so that the buffer 4 functions as a input/output buffer circuit. In this case, the sub-buffers 4a-4, 4b-4 and 4c-4 are all rendered unconductable by the signal TN so that the output becomes a high impedance. An input signal from the pad 3 is output as the signal INT to the internal circuit of the chip via the input buffer IB1.

Figure 11:
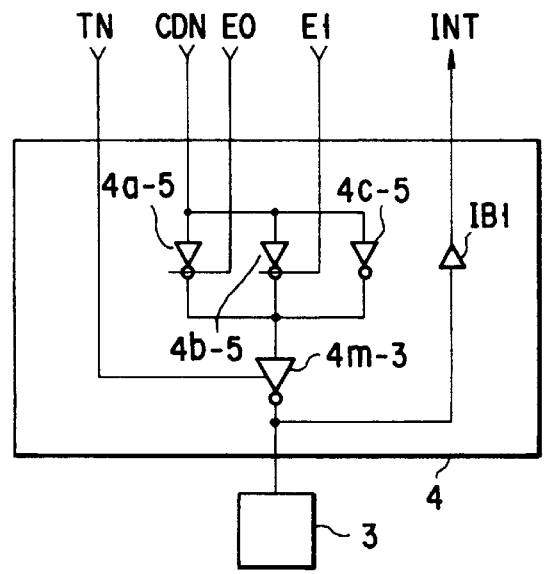
FIG. 11 is a sixth specific circuit diagram of the present invention, exemplifying the structure of an output buffer circuit.

The circuit in FIG. 11 will now be described. This circuit is a modification of the circuit in FIG. 8. A separate program terminal is provided at a last-stage buffer 4m-3 and an input buffer IB1 is added so that the buffer 4 functions as a input/output buffer circuit. In this case, the sub-buffers 4a-4, 4b-4 and 4c-4 are all rendered unconductable by the signal TN input to the program terminal of the last-stage buffer 4m-3 so that the output of the buffer 4m-3 becomes a high impedance. Then, an input signal from the pad 3 is output as the signal INT to the internal circuit of the chip via the input buffer IB1.

Figure 14:
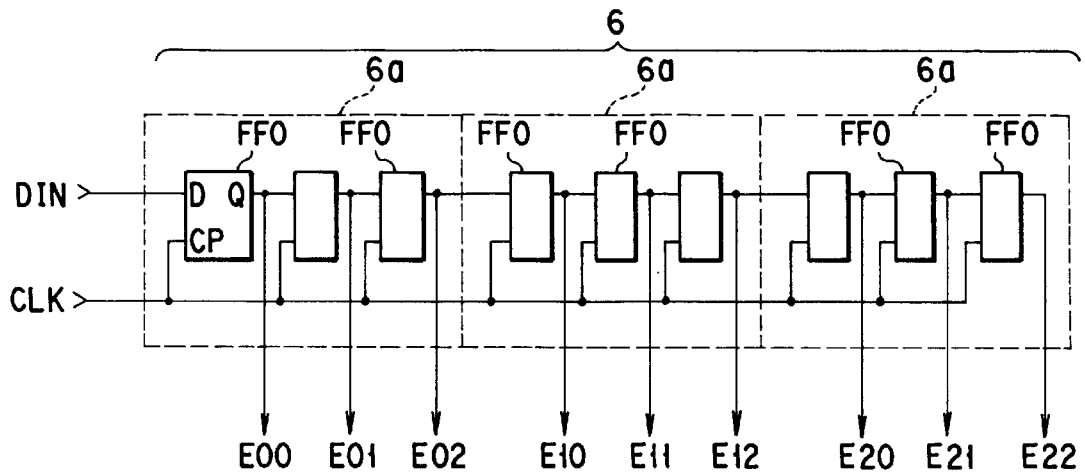
FIG. 14 is a first specific circuit diagram illustrating the structure of a latch controller according to the present invention.
Figure 15:
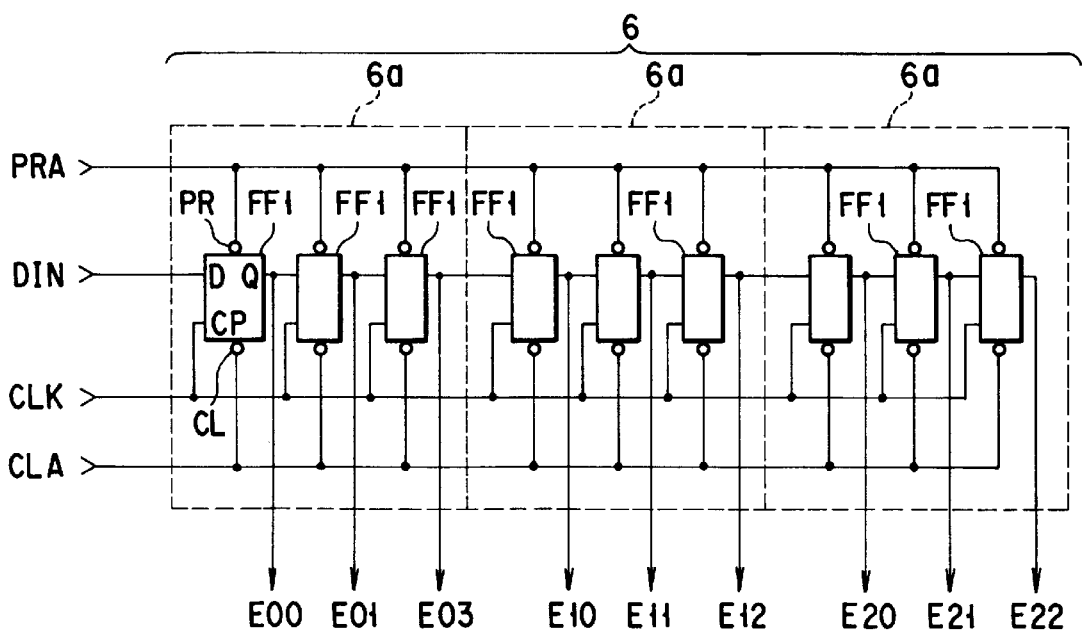
FIG. 15 is a first circuit diagram showing a modification of the circuit of FIG. 14.
Figure 16:
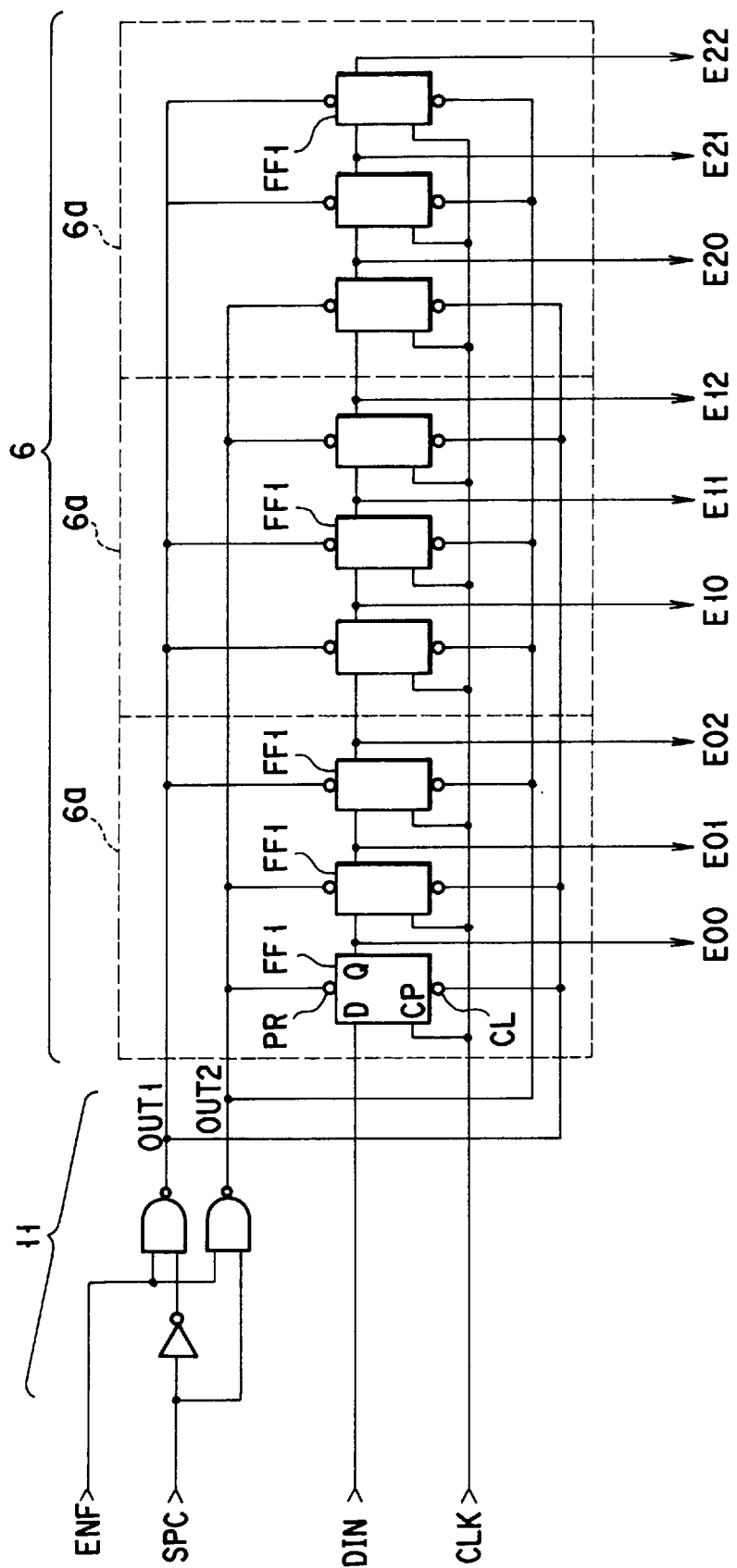
FIG. 16 is a second circuit diagram showing a modification of the circuit of FIG. 14.

FIGS. 14 through 16 present circuit diagrams illustrating specific structures of the latch controller 6 in FIG. 5. To begin with, a description will be given on the circuit of FIG. 14. Nine flip-flop circuits FF0 are cascade-connected to form a 9-bit shift register. Those flip-flop circuits FF0 receive and hold the program data DIN in synchronism with the clock signal CLK that is commonly input to terminals CP. The 9-bit output is obtained from independent output terminals Q of the flip-flop circuits FF0.

Figure 17:
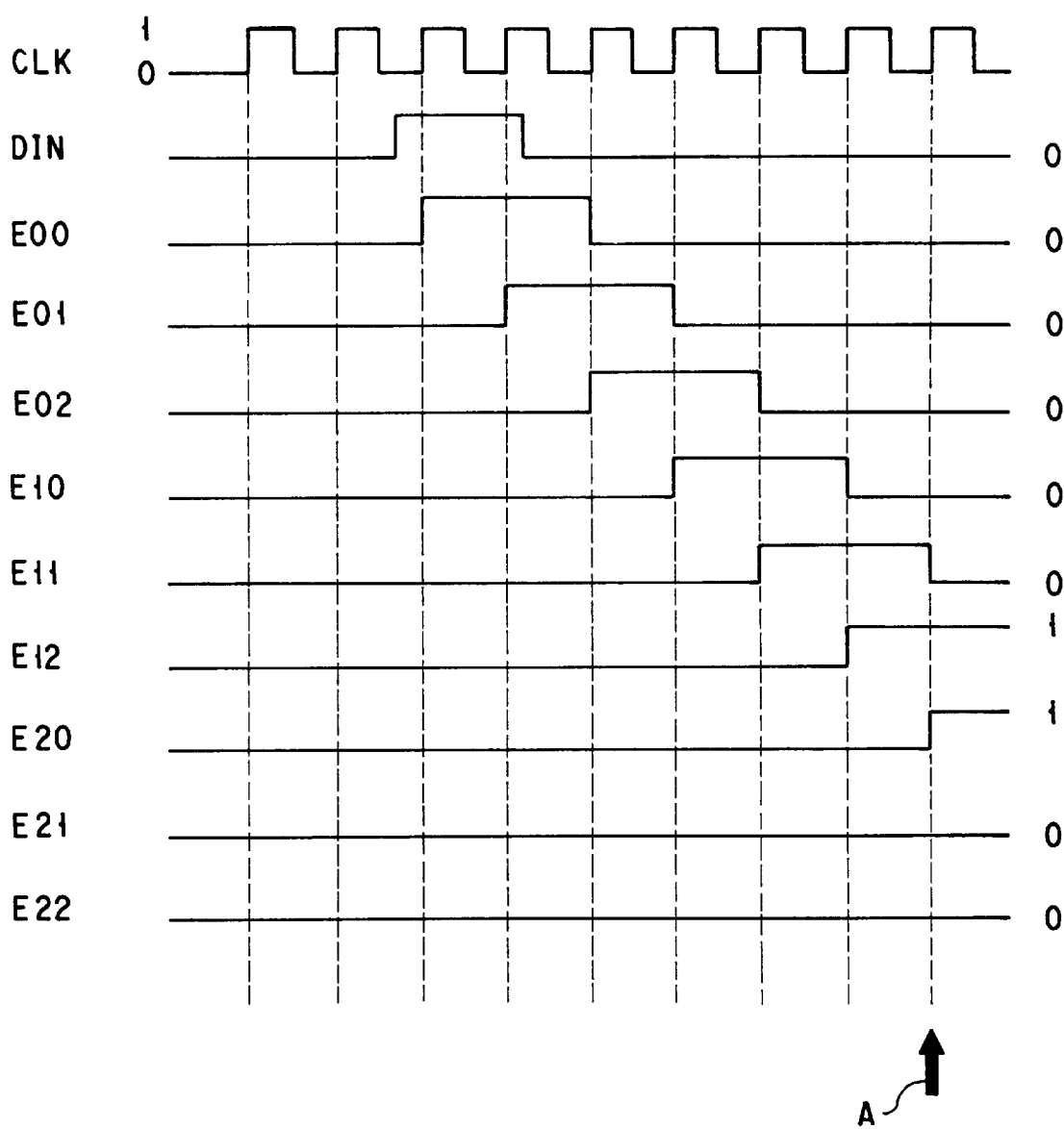
FIG. 17 presents a timing chart illustrating the operation of the circuit shown in FIG. 14.
Figures 18, 19, 20:
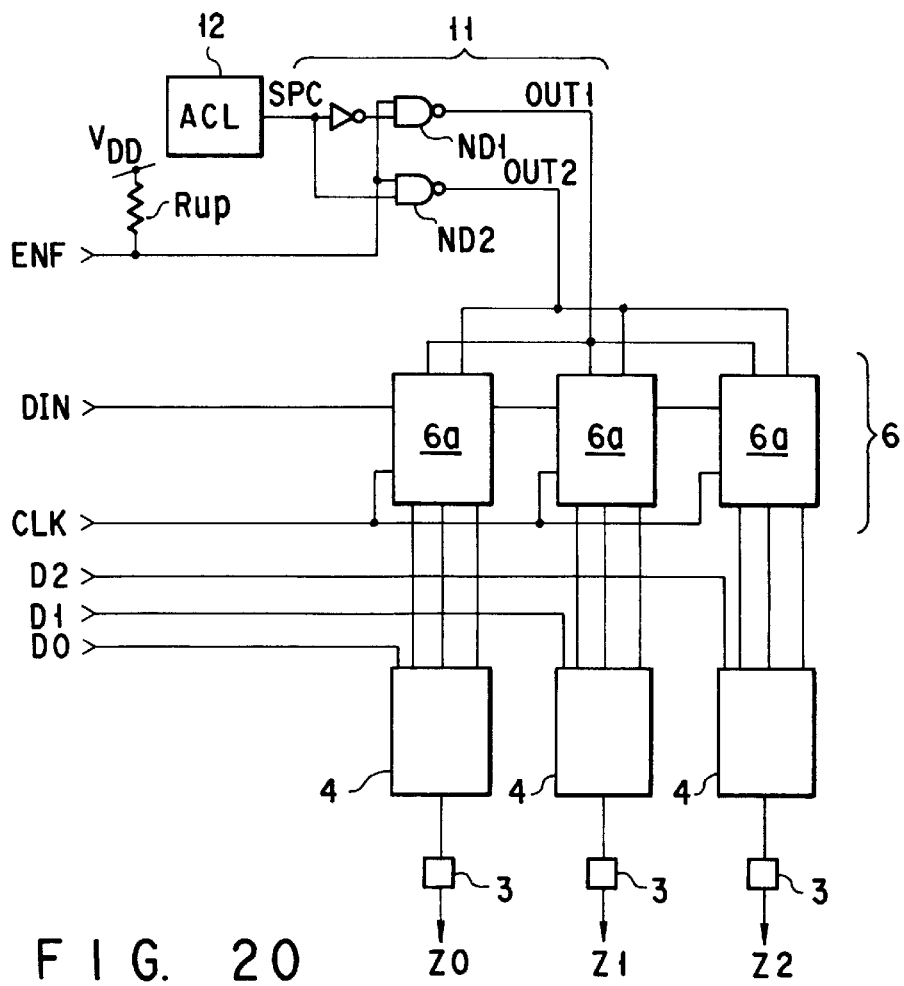
FIG. 18 illustrates the signal statuses attained according to the timing chart in FIG. 17.
FIG. 19 illustrates output settings of the circuit in FIG. 16.
FIG. 20 is a circuit diagram showing the circuit of FIG. 16 as applied to the circuit of FIG. 5.

FIG. 17 presents a timing chart illustrating the operation of the circuit shown in FIG. 14. The flip-flop circuits FF0 in FIG. 14 receive data at the rising edge of the clock signal. The output value held in the flip-flop circuits FF0 after sequential transfer of the value given by the program data DIN will appear on the 9-bit output terminal at the rising edge of the ninth clock signal CLK indicated by an arrow A. FIG. 18 shows samples of the output values attained according to the timing chart in FIG. 17.

Assuming that the outputs of the above flip-flop circuits FF0 are input, three bits each, to the program terminals of the sub-buffers 4a-1, 4b-1 and 4c-1 in FIG. 6 as the signals E0, E1 and E2, then the output current of those sub-buffers as a single buffer 4 can be set to a desired value by the combinations of "1" and "0" of those signals as shown in FIG. 18.

The circuit of FIG. 15 will now be described. This circuit is a modification of the circuit in FIG. 14, and comprises flip-flop circuits FF1 each having a preset function and a reset function. A signal PRA is input as a preset input commonly to nine preset terminals PR, and a a signal CLA is input as a reset input commonly to nine reset terminals CL. When the signal PRA is "0," the outputs of nine bits all become "1" regardless of the program data DIN. With the signal CLA being "0," the nine outputs all become "0."

The circuit of FIG. 16 will now be described. This circuit is a preset-reset controller 11 added to the circuit of FIG. 15. This controller 11 has a function to set the preset terminals PR and reset terminals CL to "1" or "0." In other words, the preset terminals PR and the reset terminals CL are selective connected to the outputs OUT1 and OUT2 of the controller 11 in advance, so that those terminals are controlled by signals ENF and SPC.

FIG. 19 illustrates output settings of the circuit in FIG. 16. With the signal ENF being "0," the value input by the program data DIN is sequentially transferred and held in the flip-flop circuits as in the circuit of FIG. 14.

FIG. 20 is a circuit diagram showing the circuit of FIG. 16 as applied to the circuit of FIG. 5. This circuit includes an auto-clear circuit 12 as the input portion for the signal SPC in the circuit of FIG. 16. The auto-clear circuit 12 so functions as to set the output to level "0" when power is given.

In determining the output level of the flip-flop circuits by the preset/reset input, every time the power of the LSI chip is set off, a level input of "1" or "0" should be given by the signal SPC in FIG. 16 at the next power-ON time. This signal input is unnecessary in the circuit of FIG. 20. A pull-up resistor $R_{up}$ to pull up the voltage to $V_{DD}$, which is connected to the input signal line for the signal ENF, is provided to fix one of the input terminals of each of two-input NAND gates ND1 and ND2 to level "1." This design allows the output of the auto-clear circuit 12 to be sent to the outputs OUT1 and OUT2 when the power is given.

If one wants to set the output of the latch circuit 6a by inputting the program data DIN, the signal ENF needs to be set to level "0" and the levels of OUT1 and OUT2 need to be fixed to "1." At this time, the resistance of the pull-up resistor $R_{up}$ is determined in such a way that the potential of the signal ENF becomes close enough to the ground potential and the current flowing through the pull-up resistor $R_{up}$ from the $V_{DD}$ level becomes sufficiently small.

FIG. 21 is a circuit diagram illustrating the structure of another embodiment of the present invention. This circuit has a ROM 21 added to the circuit of FIG. 5, so that the output characteristic of the buffer 4 can be set to the desired characteristic also by the ROM 21. A selector 22 is provided in the previous stage of each buffer 4. The selector 22 can select one of the signal from the ROM 21 in which data is pre-programmed and the signal from the 3-bit latch circuit 6a (output of the shift register) in response to a signal SEL.

In the circuit having the above structure, a signal LE3 consisting of the first 3-bit output of the shift register constituted by the latch controller 6 and a signal RE3 (three bits) of the data output of the ROM 21 are input to the selector 22, which in turn select one of the 3-bit data by the "1" or "0" level of the signal SEL. The selected 3-bit data is input to the program terminal which controls the operation of the sub-buffers (not shown) constituting the buffer 4.

When the signal SEL has a level of "1," the signal from the ROM 21 is selected, and when the signal SEL has a level of "0," the signal from the shift register is selected. The pull-up resistor $R_{up}$ for pulling up the voltage to the $V_{DD}$ level is connected to the input signal line for the signal SEL so that when the input of the signal SEL is floating, the data signal RE3 from the ROM 21 is selected.

In this example of FIG. 21, as in the circuit of FIG. 20, when the power is given, the data signal RE3 from the ROM 21 is automatically input to the program terminal of the buffer 4. The resistance of the pull-up resistor R up is set to a predetermined value as in the embodiment of FIG. 20. To set the individual outputs of the latch controller 6 (outputs of the individual latch circuits 6a) by inputting the program data DIN, therefore, the level of the signal SEL should be set to "0."

If a non-volatile memory such as $E^2PROM$ which is electrically erasable and programmable is used instead of the ROM 21, after the output characteristic of the buffer 4 is set to the characteristic which meets the system request by inputting the program data DIN, this setting data can be set again as ROM data.

The above-described embodiments can be accomplished with a considerably smaller chip-occupying area than the conventional structure which is provided with various buffer circuits and needs additional terminals for controlling the operation of those buffer circuits as well as additional pads. More specifically, as the pad area is very large so that the chip-occupying area can be suppressed by minimizing the number of pads, i.e., providing one pad (3a) for inputting program data to operate the latch controller 6 and one pad (3b) for inputting the clock signal, as well as one pad (3c) for transferring program data to another chip if necessary. The latch controller 6 and sub-buffer circuit areas 4 can be secured with an area sufficiently smaller than the pad area.

Even in consideration of the realization of the present invention on a chip, the above, therefore, the pads and the individual areas for the input circuit, output circuit and input/output circuit are hardly increased and only the number of the latch circuits to be connected to the program terminals to control the operation of the output buffer increases without causing a significant increase in chip area.

According to the structure of FIG. 4, on a board system having a plurality of LSI chips mounted thereon, if the shift registers constituted by the individual latch controllers 6 are serially connected between the chips, the output characteristics of the buffers of the entire chips on the board can be programmed by one set of a clock signal CLK and program data DIN. This function will be very effective means in evaluating the I/O circuits provided in a standard cell, gate array or the like.

Figure 22:
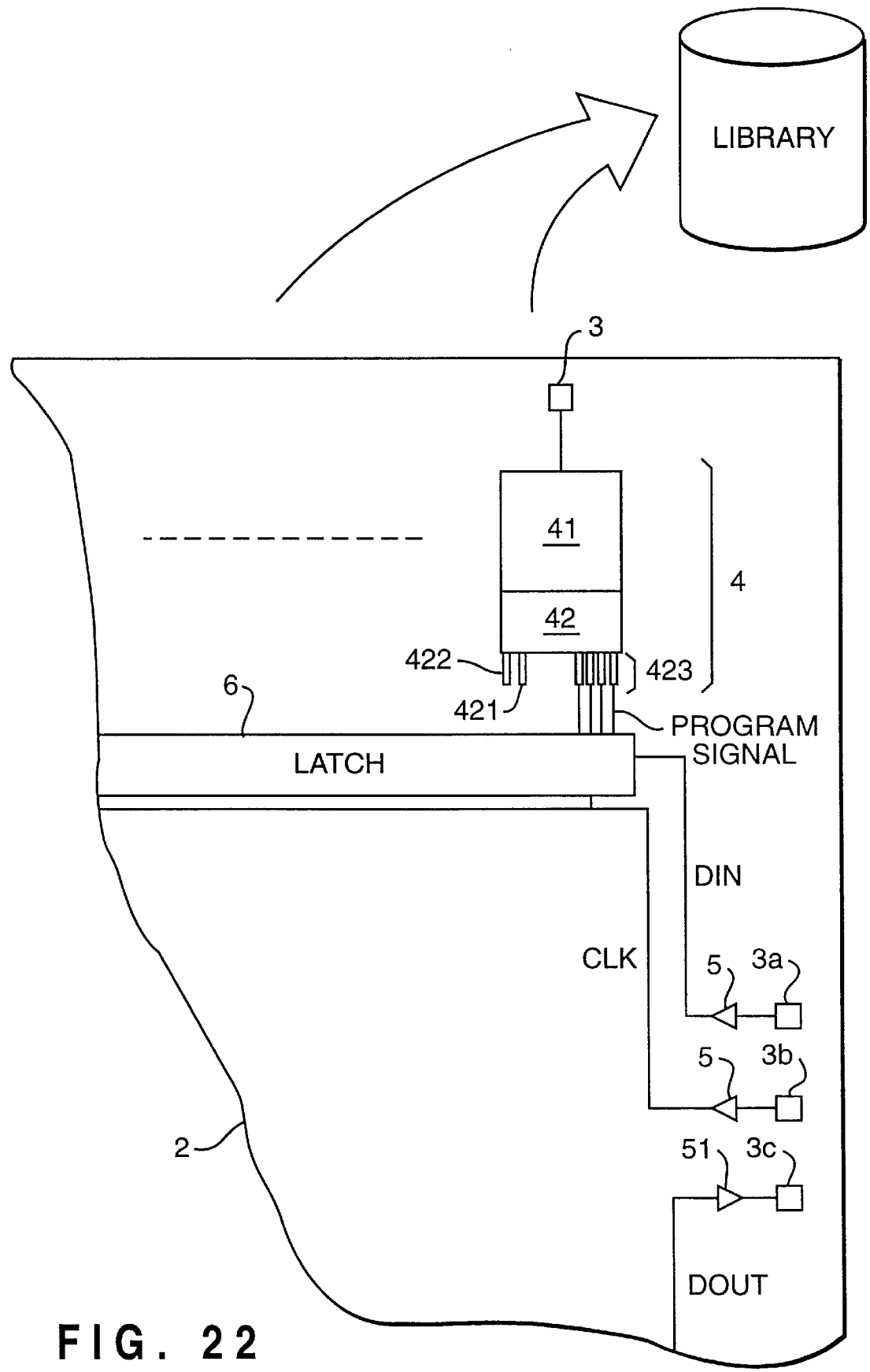
FIG. 22 is a partially schematic and partially block-diagrammatic showing of the buffer circuit of the present invention, as provided in a software library.

According to the above embodiments, if parallel-connected sub-buffers and latch controllers are previously prepared (provided in the software library, as shown in FIG. 22) as independent cells, this invention can easily be realized in a standard cell or a semi-customized IC such as gate array.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A programmable buffer circuit arranged between pads for external connection of an LSI chip and an internal circuit of the LSI chip, said buffer circuit comprising:

circuit means provided in signal lines extending from said pads to said internal circuit of said LSI chip, said circuit means including a plurality of basic elements and having control means to provide said buffer circuit with a selectable buffer circuit function and drivability by electrically connecting said basic elements with each other; and latch means, in said LSI chip and controllable by program data from the outside of said LSI chip, for supplying a program signal to said control means, wherein said latch means includes a shift register structure operable in synchronism with a clock signal, having one clock input terminal, one data input terminal, and one data output terminal for sequentially transferring said program data, each of said clock input terminal, data input terminal, and data output terminal being connected to a respective exclusive external pad provided on said LSI chip, said control means including a control circuit for receiving, as said program signal, control data different from said program signal from said latch means, said control circuit including a selector that receives said control data from a memory circuit in said LSI.

2. A programmable buffer circuit arranged between pads for external connection of an LSI chip and an internal circuit at the LSI chip, said buffer circuit comprising:

circuit means provided in signal lines extending from said pads to said internal circuit of said LSI chip, said circuit means including a plurality of basic elements and having control means to provide said buffer circuit with a selectable buffer circuit function and drivability by electrically connecting said basic elements with each other;

latch means, in said LSI chip and controllable by program data from the outside of said LSI chip, for supplying a program signal to said control means, wherein said latch means includes a shift register structure operable in synchronism with a clock signal, having one clock input terminal, one data input terminal, and one data output terminal for sequentially transferring said program data; and a memory circuit external to said LSI chip, each of said clock input terminal, data input terminal, and data output terminal being connected to a respective exclusive external pad provided on said LSI chip, said control means including a control circuit for receiving, as said program signal, control data different from said program signal from said latch means, said control circuit including a selector_ that receives said control data from said memory circuit.

3. A programmable buffer circuit arranged between pads for external connection of an LSI chip and an internal circuit of the LSI chip, said buffer circuit comprising:

circuit means provided in signal lines extending from said pads to said internal circuit of said LSI chip, said circuit means including a plurality of basic elements and having control means to provide said buffer circuit with a selectable buffer circuit function and drivability by electrically connecting said basic elements with each other; and latch means, in said LSI chip and controllable by program data from the outside of said LSI chip, for supplying a program signal to said control means, wherein said latch means includes a shift register structure operable in synchronism with a clock signal, having one clock input terminal, one data input terminal, and one data output terminal for sequentially transferring said program data, each of said clock input terminal, data input terminal, and data output terminal being connected to a respective exclusive external pad provided on said LSI chip, said control means including a control circuit for receiving, as said program signal, control data different from said program signal from said latch means, said control circuit including a selector that receives said control data from a circuit independent of said latch means in said LSI chip.

4. A programmable buffer circuit arranged between pads for external connection of an LSI chip and an internal circuit of the LSI chip, said buffer circuit comprising:

circuit means provided in signal lines extending from said pads to said internal circuit of said LSI chip, said circuit means including a plurality of basic elements and having control means to provide said buffer circuit with a selectable buffer circuit function and drivability by electrically connecting said basic elements with each other;

latch means, in said LSI chip and controllable by program data from the outside of said LSI chip, for supplying a program signal to said control means, wherein said latch means includes a shift register structure operable in synchronism with a clock signal, having one clock input terminal, one data input terminal, and one data output terminal for sequentially transferring said program data; and a circuit independent of said latch means and external to said LSI chip, each of said clock input terminal, data input terminal, and data output terminal being connected to a respective exclusive external pad provided on said LSI chip, said control means including a control circuit for receiving, as said program signal, control data different from said program signal from said latch means, said control circuit including a selector that receives said control data from said independent circuit.

5. A programmable buffer circuit arranged between pads for external connection of an LSI chip and an internal circuit of the LSI chip, said buffer circuit comprising:

circuit means provided in signal lines extending from said pads to said internal circuit of said LSI chip, said circuit means including a plurality of basic elements and having control means to provide said buffer circuit with a selectable buffer circuit function and drivability by electrically connecting said basic elements with each other; and latch means, in said LSI chip and controllable by program data from the outside of said LSI chip, for supplying a program signal to said control means, wherein said latch means includes a shift register structure operable in synchronism with a clock signal, having one clock input terminal, one data input terminal, and one data output terminal for sequentially transferring said program data, each of said clock input terminal, data input terminal, and data output terminal being connected to a respective exclusive external pad provided on said LSI chip, said control means including a control circuit for receiving, as said program signal, control data different from said program signal from said latch means, said control circuit including a selector that can select one of a plurality of signals as said control data, the plurality of signals being received from a circuit independent of said latch means in said LSI chip.

6. A programmable buffer circuit arranged between pads for external connection of an LSI chip and an internal circuit of the LSI chip, said buffer circuit comprising:

circuit means provided in signal lines extending from said pads to said internal circuit of said LSI chip, said circuit means including a plurality of basic elements and having control means to provide said buffer circuit with a selectable buffer circuit function and drivability by electrically connecting said basic elements with each other;

latch means, in said LSI chip and controllable by program data from the outside of said LSI chip, for supplying a program signal to said control means, wherein said latch means includes a shift register structure operable in synchronism with a clock signal, having one clock input terminal, one data input terminal, and one data output terminal for sequentially transferring said program data; and a circuit independent of said latch means and external to said LSI chip, said independent circuit supplying a plurality of signals, each of said clock input terminal, data input terminal, and data output terminal being connected to a respective exclusive external pad provided on said LSI chip, said control means including a control circuit for receiving, as said program signal, control data different from said program signal from said latch means, said control circuit including a selector that can select one of the plurality of signals as said control data from said independent circuit.

* * * * *

UNITED STATES PATENT AND TRADEMARK OFFICE
CERTIFICATE OF CORRECTION

PATENT NO. : 5,804,987
DATED : September 8, 1998
INVENTOR(S) : Kyohsuke OGAWA et al.

It is certified that error appears in the above-indentified patent and that said Letters Patent is hereby corrected as shown below:

Claim 1, Col. 9, line 22, after "LSI", insert --chip--.

Claim 2, Col. 9, line 48, "selector_" should read --selector--.

Signed and Sealed this

Second Day of January, 2001

Attest:

Q. TODD DICKINSON

*Attesting Officer*  *Commissioner of Patents and Trademarks*